United States Patent
Liu et al.

(10) Patent No.: US 8,993,424 B2
(45) Date of Patent: Mar. 31, 2015

(54) METHOD FOR FORMING A SEMICONDUCTOR TRANSISTOR DEVICE WITH OPTIMIZED DOPANT PROFILE

(75) Inventors: Chia-Wen Liu, Taipei (TW); Tsung-Hsing Yu, Taipei (TW); Dhanyakumar Mahaveer Sathaiya, Hsinchu (TW); Wei-Hao Wu, Hsinchu (TW); Ken-Ichi Goto, Hsin-Chu (TW); Tzer-Min Shen, Hsinchu (TW); Zhiqiang Wu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 138 days.

(21) Appl. No.: 13/288,201

(22) Filed: Nov. 3, 2011

(65) Prior Publication Data

US 2013/0113041 A1      May 9, 2013

(51) Int. Cl.
*H01L 21/425*    (2006.01)
*H01L 21/336*    (2006.01)
*H01L 29/66*    (2006.01)
*H01L 29/78*    (2006.01)
*H01L 29/10*    (2006.01)
(Continued)

(52) U.S. Cl.
CPC ...... *H01L 29/66492* (2013.01); *H01L 29/6659* (2013.01); *H01L 29/7833* (2013.01); *H01L 29/1045* (2013.01); *H01L 29/105* (2013.01); *H01L 29/1054* (2013.01); *H01L 29/165* (2013.01); *H01L 21/26506* (2013.01); *H01L 21/26586* (2013.01); *Y10S 438/931* (2013.01)
USPC ........... 438/525; 438/302; 438/289; 438/527; 438/931; 438/530

(58) Field of Classification Search
CPC ................. H01L 21/26586; H01L 21/823807; H01L 21/28176; H01L 21/3148; H01L 21/823412
USPC .......... 438/289, 302, 527, 931, 306, 525, 530
See application file for complete search history.

(56) References Cited

U.S. PATENT DOCUMENTS 5,786,251 A * 7/1998 Harris et al. .................. 438/268
6,358,806 B1 * 3/2002 Puchner ....................... 438/308
(Continued)

OTHER PUBLICATIONS

Hokazono, A. et al., "Steep Channel Profiles in n/pMOS Controlled by Boron-doped Si:C Layers for Continual Bulk-CMOS Scaling", 2009 IEEE International Electron Devices Meeting (IEDM), 4 pages.
(Continued)

*Primary Examiner* — Shouxiang Hu
(74) *Attorney, Agent, or Firm* — Duane Morris LLP

(57) ABSTRACT

Provided is a transistor and a method for forming a transistor in a semiconductor device. The method includes performing at least one implantation operation in the transistor channel area, then forming a silicon carbide/silicon composite film over the implanted area prior to introducing further dopant impurities. A halo implantation operation with a very low tilt angle is used to form areas of high dopant concentration at edges of the transistor channel to alleviate short channel effects. The transistor structure so-formed includes a reduced dopant impurity concentration at the substrate interface with the gate dielectric and a peak concentration about 10-50 nm below the surface. The dopant profile also includes the transistor channel having high dopant impurity concentration areas at opposed ends of the transistor channel.

17 Claims, 5 Drawing Sheets

(51) Int. Cl.
*H01L 29/165* (2006.01)
*H01L 21/265* (2006.01)

(56) References Cited

U.S. PATENT DOCUMENTS

| | | | |
|---|---|---|---|
| 6,372,587 B1* | 4/2002 | Cheek et al. | 438/302 |
| 6,514,843 B2* | 2/2003 | Dokumaci et al. | 438/595 |
| 7,351,637 B2* | 4/2008 | Tucker | 438/289 |
| 2006/0141716 A1* | 6/2006 | Rouh et al. | 438/289 |
| 2007/0013006 A1* | 1/2007 | Mirabedini et al. | 257/369 |
| 2008/0293204 A1* | 11/2008 | Nieh et al. | 438/291 |
| 2009/0102026 A1* | 4/2009 | Lee et al. | 257/635 |
| 2011/0049624 A1* | 3/2011 | Guo et al. | 257/347 |
| 2011/0049626 A1* | 3/2011 | Lin et al. | 257/347 |
| 2011/0309447 A1* | 12/2011 | Arghavani et al. | 257/368 |
| 2013/0043511 A1* | 2/2013 | Tsai et al. | 257/288 |

OTHER PUBLICATIONS

Hokazono, A. et al., "Steep Channel & Halo Profiles Utilizing Boron-Barrier Layers (Si:C) for 32 nm Node and Beyond", IEEE 2008 Symposium on VLSI Technology Digest of Technical Papers, pp. 112-113.

* cited by examiner

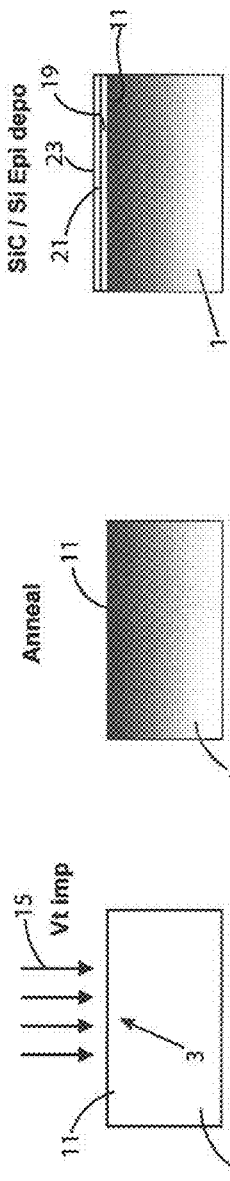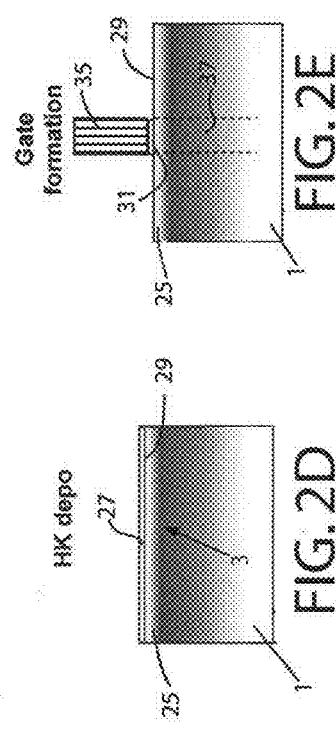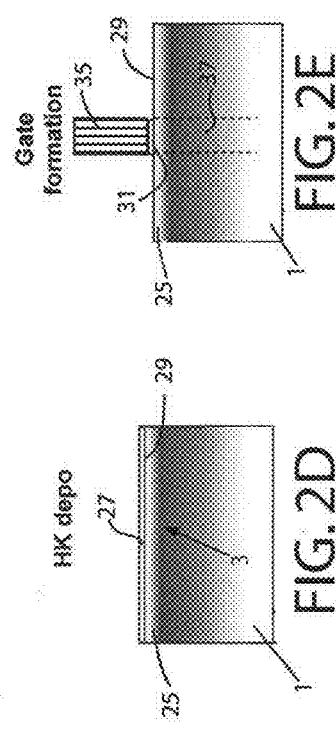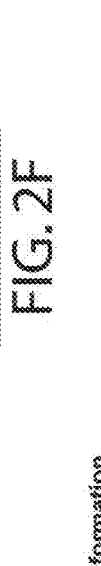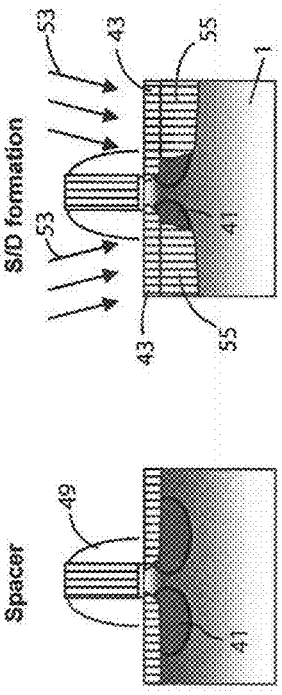

METHOD FOR FORMING A SEMICONDUCTOR TRANSISTOR DEVICE WITH OPTIMIZED DOPANT PROFILE

TECHNICAL FIELD

The disclosure relates to semiconductor devices and manufacturing methods for the same, and, more particularly, to a robust transistor device with an optimized dopant profile resistant to processing variations, and methods for forming the robust transistor device.

BACKGROUND

Transistors are highly utilized components in integrated circuit and other semiconductor devices. Transistors are used for amplifying or switching electronic signals and provide functionality to the integrated circuit or other semiconductor devices. Transistors may be N-type transistors with N-type transistor channels, or P-type transistors with P-type transistor channels. Transistors may be formed using various techniques and materials, but require accurate and precise placement of their various components and constituents to operate optimally and efficiently, especially as dimensions continue to shrink to meet advanced integration requirements. One such constituent is the dopant impurities that are introduced into the channel region because they directly influence the functionality and performance of the transistor device. The characteristics and location of the dopant impurities, i.e. the dopant profile, must be carefully controlled.

A multitude of separate processing operations are used in combination to form the structural features of transistor devices and introduce and place the dopant impurities at proper concentration levels, in the transistor channel and other regions such as the source/drain regions. Fluctuations in any of these processing operations can cause variation in the transistor device and performance degradation. This is especially true with respect to the operations used to introduce and place dopant impurities in the transistor channel and other regions such as the source/drain regions. It would therefore be desirable to provide transistor devices with well-controlled dopant impurity profiles.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

FIGS. 2A-2H are cross-sectional views illustrating a sequence of processing operations used to form a transistor device according to one embodiment of the disclosure;

DETAILED DESCRIPTION

The disclosure provides a semiconductor transistor and a method for forming the transistor that utilizes a channel region with a film stack including at least one epitaxially-formed semiconductor material layer disposed over the substrate channel region of the transistor. The transistor channel is doped with dopant impurities, some introduced before and some introduced after formation of the film stack, thereby tailoring the profile of dopants in the transistor channel. The tailored dopant profile includes a reduced channel dopant impurity concentration at the interface between the transistor channel and the gate dielectric and also includes dopant impurity regions of high concentration at each of the opposed ends of the transistor channel. According to some exemplary embodiments, a small tilt angle is used to form the high concentration dopant impurity regions at the edges of the channel. As a result of the formation techniques used, the transistors so-formed are resistant to variations in processing operations and are resistant to short channel effects which arise when the channel length is reduced to increase integration levels and operational speed of the transistor.

Figure 1:
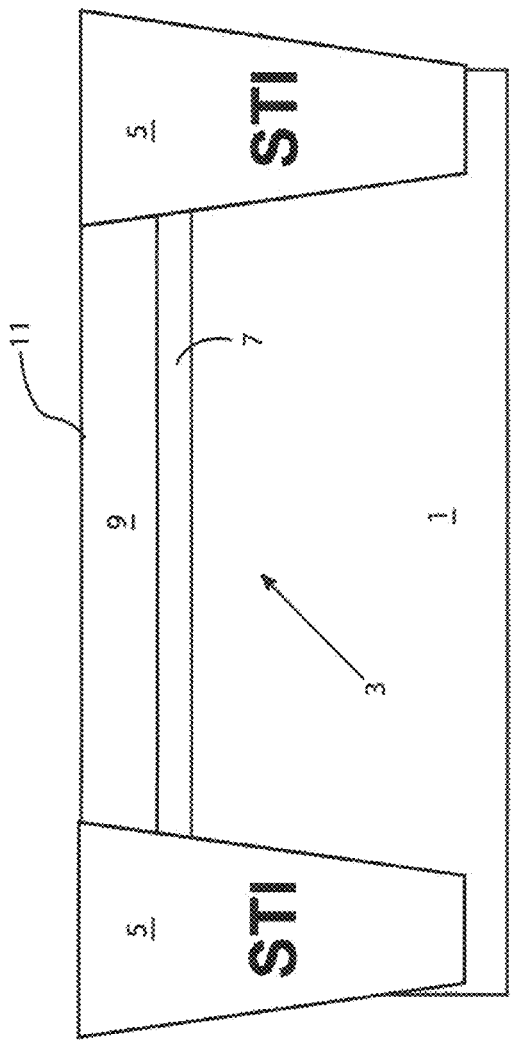
FIG. 1 is a cross-sectional view of an exemplary film structure used in transistor formation according to one exemplary embodiment of the disclosure.

FIG. 1 is a cross-sectional view showing semiconductor substrate 1 with transistor region 3 disposed between two STI (shallow trench isolation) structures 5. A transistor will be formed in transistor region 3 to include a channel region with an optimized dopant profile and source/drain regions including separate lightly doped drain, LDD, regions according to one exemplary embodiment. The structure of FIG. 1 shows exemplary SiC layer 7, epitaxial silicon layer 9 and top surface 11. SiC layer 7 and epitaxial silicon layer 9 are undoped. The exemplary transistors will also include a gate dielectric and gate electrode formed over top surface 11.

FIGS. 2A-2H illustrate an exemplary sequence of processing operations according to one exemplary embodiment of the disclosure. FIG. 2A shows a well/$V_t$ implant operation used to introduce dopant impurities into substrate 1, particularly in transistor region 3 within which the transistor channel will be formed. Arrows 15 indicate the introduction of the dopant impurities, which may be P-type dopant impurities such as boron or other suitable species, according to one exemplary embodiment, and may be N-type dopant impurities such as phosphorous, antimony, or arsenic, according to other exemplary embodiments. An optional screen oxide layer (not shown) having a thickness of about 50-90 angstroms may be formed over top surface 11 in various exemplary embodiments. As will be referred to hereinafter, the $V_t$ implant introduces dopant impurities of a first dopant impurity type (either N-type or P-type) and is a lower power implant. The $V_t$ implant may use an implant energy of less than 25eV and in one exemplary embodiment, the implant energy may be about 5-15eV. Various suitable implantation powers and energies may be used. The $V_t$ implant introduces impurities into the channel to adjust the $V_t$ (threshold voltage) applied to the transistor to open the channel to current flow and may also be referred to as a $V_t$ adjust implant.

An annealing operation that may be used to activate the introduced dopants, cure crystalline defects and cause diffusion and redistribution of dopant impurities, takes place in FIG. 2B. Various conventional annealing operations may be used and the annealing operations may drive the implanted dopant impurities deeper into semiconductor substrate 1 as indicated by darkness gradient of FIG. 2B. FIG. 2C shows a film stack formed over top surface 11. SiC layer 19 may be epitaxially deposited over top surface 11 and may include a thickness of about 2-20 nanometers in various exemplary embodiments. Epitaxial silicon layer 21 is formed over SiC layer 19 using epitaxial deposition or other suitable methods. Epitaxial silicon layer 21 may include a thickness of about 5-20 nanometers in various exemplary embodiments and may include a thickness of about 8 nanometers in one exemplary embodiment and includes top silicon surface 23. Silicon carbide, SiC, retards dopant diffusion. Each of SiC layer 19 and epitaxial silicon layer 21 is undoped.

Now turning to FIG. 2D, the film stack of SiC layer 19 and epitaxial silicon layer 21 appears as composite layer 25 in FIG. 2D. High-k dielectric layer 27 is formed over upper surface 29 of composite layer 25. High-k dielectric layer 27 may be formed using various suitable dielectric deposition processes. Upper surface 29 is a silicon surface. According to one exemplary embodiment, hafnium oxide (HfO) may be used, but other suitable high-k gate dielectric materials may be used as high-k dielectric layer 27, in other exemplary embodiments. An optional insulator layer may also be used in conjunction with high-k dielectric layer 27, but is not included in the illustrated embodiment of FIG. 2D. High-k dielectric layer 27 may include a thickness of 2 nanometers in one exemplary embodiment, but may include a thickness that ranges from about 1-20 nanometers in various other exemplary embodiments.

A gate stack is formed as shown in FIG. 2E. The gate stack includes gate electrode 35 and gate dielectric 31 formed from high-k gate dielectric 27 shown in FIG. 2D. The gate stack also defines channel region 37 within semiconductor substrate 1. Gate electrode 35 may advantageously be formed of polysilicon or other suitable materials and may be formed using conventional or later developed methods. Various patterning techniques may be used to pattern gate electrode 35 and gate dielectric 31. The gate stack is formed over upper surface 29 of composite film structure 25 which is largely undoped because SiC layer 19 and epitaxial silicon layer 21 were formed after the $V_t$ implantation operation and anneal.

With the gate stack in place, LDD and halo implant operations are then carried out as shown in FIG. 2F. A lightly doped drain, LDD, operation may be used to form LDD impurity region 43 within semiconductor substrate 1. Each of the LDD and halo implant operations introduce dopant impurities through upper surface 29. The LDD dopant introduction operation and LDD structure 43 is formed of a second impurity type, opposite the first impurity type of the well/$V_t$ implant shown in FIG. 2A. According to one advantageous embodiment, LDD region 43 may be N-type with the well/$V_t$ implant operation being P-type. A halo implantation operation is an angled ion implantation process as indicated by arrows 45 in FIG. 2F. Tilt angle 47 may be 15 degrees or less with respect to the vertical, according to various exemplary embodiments. The halo implantation operation introduces dopant impurities of the same dopant impurity type, as the well/$V_t$ implantation into the ledger, but not the central portion, of channel region 37. According to one exemplary and advantageous embodiment, the halo implantation operation may introduce P-type dopant impurities although N-type dopant impurities may be implanted in other exemplary embodiments. In one exemplary embodiment, the halo implantation operation may be used to introduce a mixture of indium and carbon, and in another exemplary embodiment, the halo implantation operation may be used to introduce indium and boron, such as present in $BF_2$. The implantation conditions and tilt angle are chosen to produce a dopant impurity profile shown in more detail in FIG. 3 and to produce high concentration dopant regions 41 at the opposed edges of channel region 37 as also shown in FIG. 2F. The low tilt angle 47 and presence of undoped composite film layer 25 at the interface between upper surface 29 and gate dielectric 31 in channel region 37 provides a low dopant concentration in the center of channel region 37 at the interface between gate dielectric 31 and upper surface 29. This, too, will be shown in further detail in FIG. 3.

FIG. 2G shows the structure of FIG. 2F after spacers 49 are formed. Various conventional methods may be used and spacers 49 may be formed of oxide silicon nitride, or combinations thereof.

FIG. 2H shows source/drain implantation operation indicated by arrows 53 which form source/drains 55. Source/drains 55 are formed of the same, second dopant impurity type as LDD regions 43, and according to one advantageous embodiment, LDD region 43 and source/drain regions 45 are N-type regions. After the source/drain formation operation is carried out as shown in FIG. 2H, further processing operations are used to complete processing of the transistor and interconnect the transistor structure to other device features.

Figure 3:
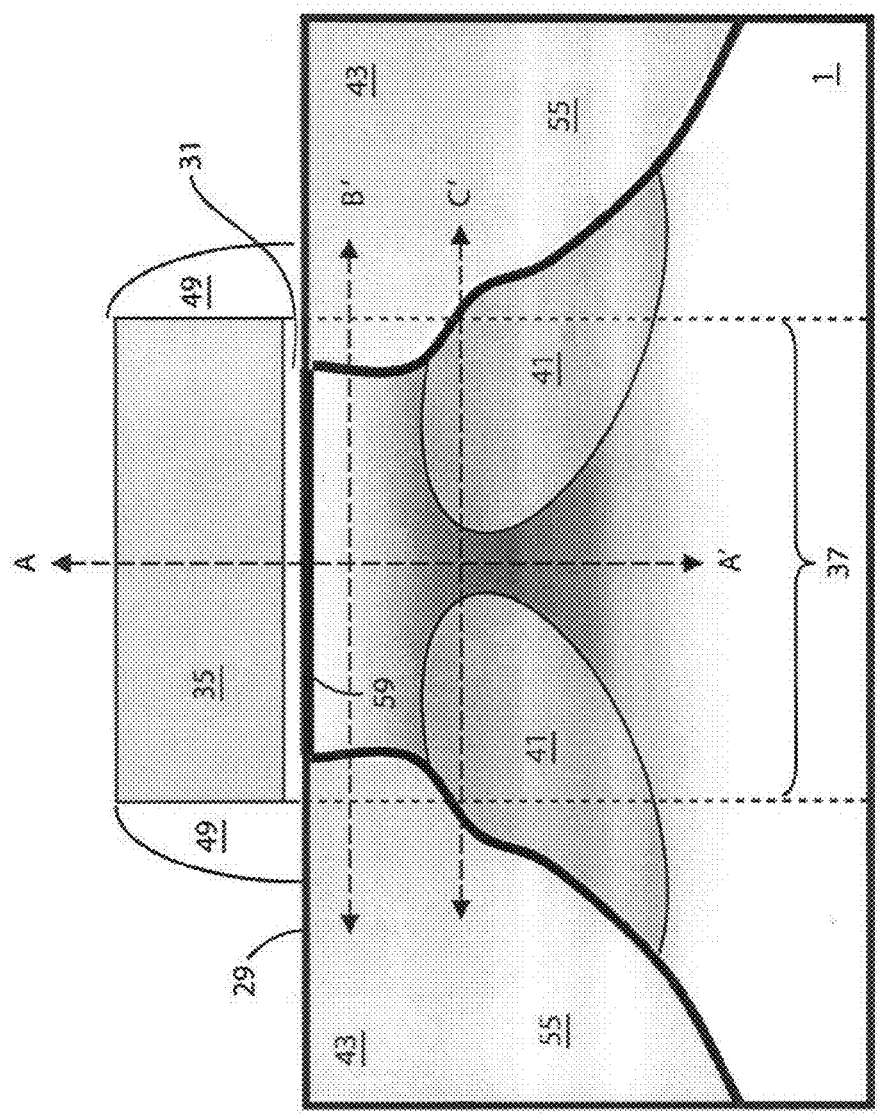
FIG. 3 is a cross-sectional view of an exemplary transistor according to one exemplary embodiment of the disclosure.

FIG. 3 is a cross-sectional view showing an exemplary transistor formed according to the exemplary processing sequence illustrated in FIGS. 2A-2H and more clearly illustrates details of the dopant impurity profile, particularly within and adjacent channel region 37. The transistor in FIG. 3 includes channel region 37, which may advantageously be formed of P-type dopant impurities according to the embodiment in which an NMOS transistor is formed. High concentration dopant regions 41 may be formed of P-type dopant impurities at higher concentration levels than other parts of channel region 37, according to the advantageous exemplary embodiment. Source/drains 55 and LDD regions 43 may be formed of N-type dopant impurities according to the embodiment in which the illustrated transistor is an N-type transistor. Interface 59 is formed between the silicon of upper surface 29 and gate dielectric 31 in channel region 37. Silicon carbide retards boron and indium diffusion and its presence maintains a suppressed dopant concentration below $1e18$ $cm^{-3}$ at interface 59, which reduces susceptibility to random dopant fluctuation. The dopant profile in channel region 37 is shown graphically in FIGS. 4-6, each of which represent an exemplary embodiment and are not intended to be limiting of the transistor formed according to the disclosure. Each of the graphs of FIGS. 4-6 represent an exemplary embodiment in which the $V_t$ implant and halo implant operations introduce P-type dopant impurities, and illustrate total concentration of P-type dopant impurities within channel region 37.

Figure 4:
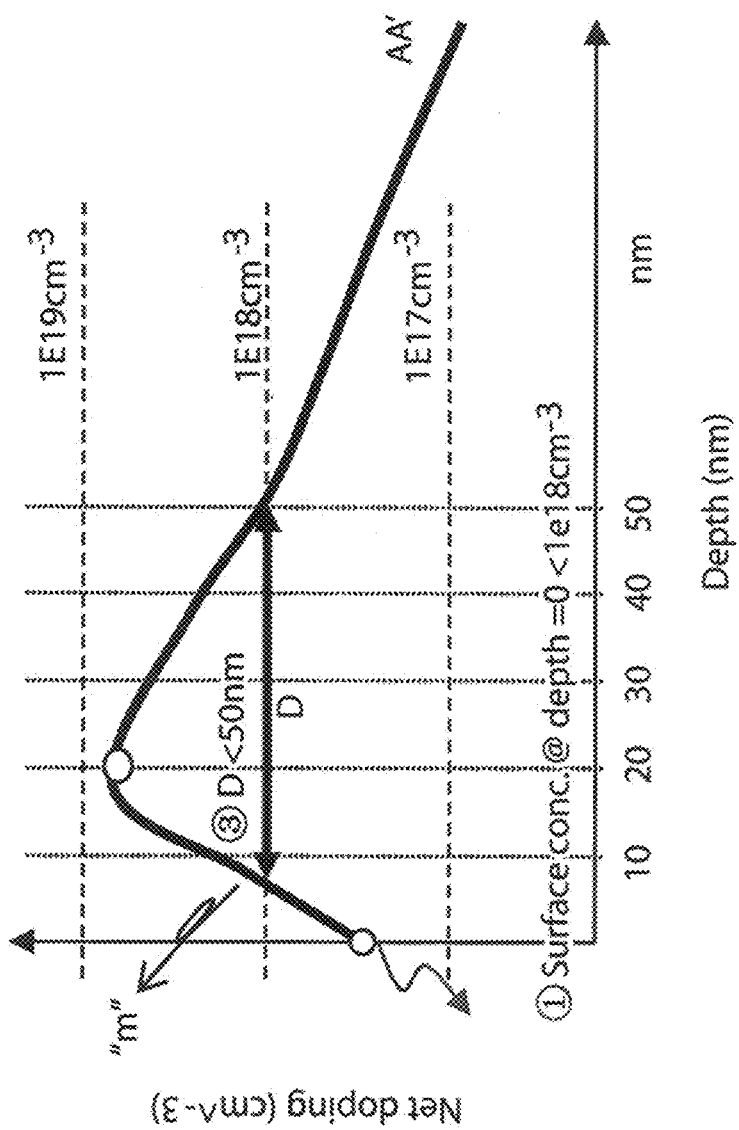
FIG. 4 is a graph that plots dopant concentration as a function of depth in an exemplary transistor channel according to one exemplary embodiment of the disclosure.

FIG. 4 is a graph showing dopant impurity concentration as a function of depth into substrate 1 taken along line A-A' of FIG. 3 and starting from upper surface 29 of FIG. 3, i.e. depth=0 signifies the interface 59 between upper surface 29 and gate dielectric 31. FIG. 4 shows that dopant concentration at upper surface 29, which is a silicon surface as epitaxial layer 21 is disposed over subjacent SiC layer 19, is less than $1e18$ $cm^{-3}$. This is intended to be exemplary only. FIG. 4 also shows that the peak dopant impurity concentration occurs about 10-30 nm below upper surface 29 and is located at about 20 nm from the silicon surface in the exemplary graph of FIG. 4. FIG. 4 also shows that the region "D" in which the dopant concentration is greater than $1e18$ $cm^{-3}$ includes a depth of less than 50 nanometers. In summary, FIG. 4 shows that the dopant impurity concentration is less than $1e18$ $cm^{-3}$ at the interface with the gate dielectric and increases to a peak location about 10-30 nm from the silicon surface and that the region having a dopant impurity concentration greater than $1e18$ $cm^{-3}$ extends for less than about 50 nanometers. The slope "m" of the increase of dopant concentration as a function of depth from the interface, is significant and may represent an increase of about 1 decade of concentration per about 1-20 nm of channel depth.

Figure 6:
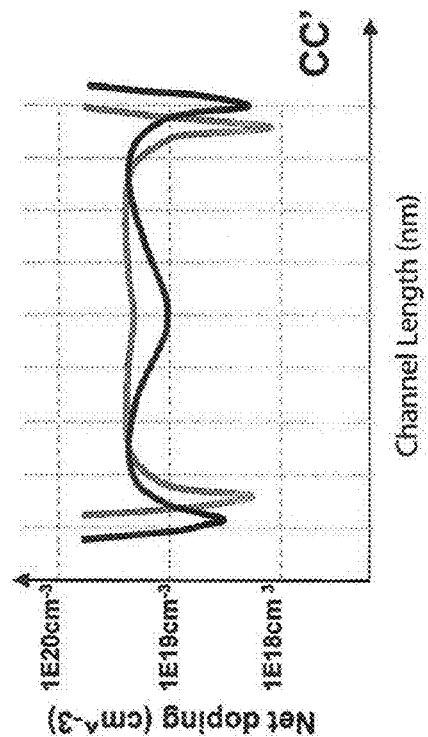
FIGS. 5 and 6 are graphs plotting dopant concentration across a transistor channel according to one exemplary embodiment of the disclosure.
Figure 5:
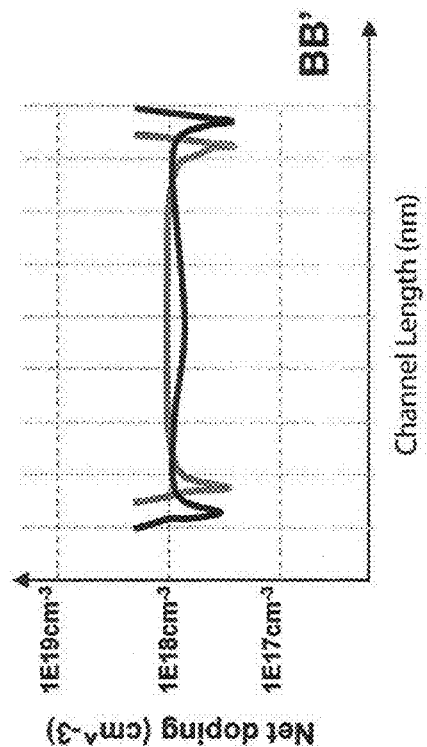

FIGS. 5 and 6 show dopant impurity concentration across channel region 37 at different depths. FIG. 5 shows the dopant impurity concentration along line BB' and FIG. 6 shows the dopant concentration along line CC'. Line BB' and CC' each run left-right along the channel length direction. FIGS. 5 and 6 are presented to show that the nominal dopant concentration is greater at line CC', which is disposed further below interface 59, than line BB'. FIGS. 5 and 6 each show that dopant concentration is higher at the edges of channel region 37 than at the center. The high concentration value of the dopant impurities at each of the opposed ends of the channel is attributable to high concentration dopant regions 41. The slope at the opposed edges of the channel representing the increase in dopant concentration, may be at least 1 decade of concentration per about 40 nm of channel distance.

Although the above exemplary embodiment has been described for a PMOS transistor, the disclosure applies equally to NMOS transistors according to an embodiment in which the dopant types are reversed from those described herein.

According to one aspect, the disclosure provides a method for forming a transistor. The method comprises providing a semiconductor substrate; introducing dopant impurities of a first impurity type into a transistor region of the semiconductor substrate, the transistor region including a channel region and source/drain regions; forming a silicon carbide layer over the transistor region and forming a silicon layer over the silicon carbide layer. The method further comprises forming a dielectric over the silicon layer; forming a gate electrode over the channel region; performing an angled ion implant to introduce further dopant impurities of the first impurity type, into the semiconductor substrate at edges of the channel region; and forming source/drain impurity structures in the source/drain regions.

Also provided is an improvement in a method for forming a transistor on the semiconductor substrate. The improvement comprises forming a composite film structure over a transistor channel after implanting dopant impurities of a first impurity type into the channel, prior to forming a gate electrode over the transistor channel and prior to performing an angled ion implantation operation that implants further dopant impurities of the first impurity type, the composite film structure comprising a silicon layer disposed over a silicon carbide layer.

According to another aspect, a transistor disposed on the semiconductor substrate is provided. The transistor comprises a gate electrode formed in a channel region over a gate dielectric formed over a substrate surface. The transistor further comprises a transistor channel formed in the substrate in the channel region and having a peak dopant concentration about 10-30 nanometers below the substrate surface, a surface dopant concentration less than about 1e18 cm$^{-3}$ at the surface, and the transistor channel having edge portions aligned beneath opposed edges of the gate electrode and having higher dopant concentrations than the central portion of the channel.

The preceding merely illustrates the principles of the disclosure. It will thus be appreciated that those skilled in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those skilled in the art without departing from the scope and range of equivalents of the disclosure.

What is claimed is:

1. A method for forming a transistor comprising:
   providing a semiconductor substrate;
   introducing dopant impurities of a first impurity type into a transistor region of said semiconductor substrate, said transistor region including a channel region and source/drain regions, said introducing dopant impurities comprising ion implantation;
   forming a silicon carbide layer over said channel region, said silicon carbide layer being undoped;
   forming a silicon layer over said silicon carbide layer;
   forming a gate dielectric over said silicon layer over said channel region;
   forming a gate electrode over said gate dielectric over said channel region; and
   after said forming a gate electrode, performing an angled ion implantation operation to introduce further dopant impurities of said first impurity type, into said semiconductor substrate at edges of said channel region, said angled ion implantation operation taking place when regions immediately adjacent said channel region include an exposed surface of said silicon layer.

2. The method as in claim 1, wherein said ion implantation comprises a $V_t$ channel implantation.

3. The method as in claim 1, wherein said forming a gate dielectric comprises forming a high-k gate dielectric material.

4. The method as in claim 3, wherein said forming a gate dielectric comprises depositing a layer of said high-k gate dielectric material.

5. The method as in claim 1, further comprising introducing source/drain dopant impurities in said source/drain regions.

6. The method as in claim 5, further comprising performing a lightly doped drain (LDD) implantation operation introducing opposite dopant impurities of the opposite impurity type, into said transistor region after said forming a gate electrode and prior to said performing an angled ion implantation operation.

7. The method as in claim 1, wherein said performing an angled ion implantation operation includes a tilt angle of less than 15° with respect to the vertical, and does not introduce said further dopant impurities into a central portion of said channel region.

8. The method as in claim 1, wherein said performing an angled ion implantation operation comprises introducing indium and carbon.

9. The method as in claim 1, wherein said forming a silicon carbide layer and said forming a silicon layer each comprise epitaxial deposition.

10. The method as in claim 1, wherein said performing an angled ion implantation operation implants said further dopant impurities of the first impurity type to a peak dopant concentration of about 10-30 nanometers below a surface of said semiconductor substrate and wherein said introducing and said performing produce said channel region including a surface dopant concentration of said first impurity type of less than about 1e18 $cm^{-3}$.

11. A method for forming a transistor comprising:
providing a semiconductor substrate;
introducing dopant impurities of a first impurity type into a transistor region of said semiconductor substrate, said transistor region including a channel region and source/drain regions;
forming a silicon carbide layer over said transistor region, said silicon carbide layer being undoped;
forming a silicon layer over said silicon carbide layer;
forming a gate dielectric over said silicon layer over said channel region;
forming a gate electrode over said gate dielectric over said channel region; and
after said forming a gate electrode, performing an angled ion implantation operation to introduce further dopant impurities of said first impurity type, into said semiconductor substrate at edges of said channel region, said angled ion implantation operation taking place when regions immediately adjacent said channel region include said exposed surface of said silicon layer and through said exposed surface, and further comprising annealing after said introducing dopant impurities and prior to said forming a silicon carbide layer.

12. In a method for forming a transistor on a semiconductor substrate, the improvement comprising:
forming a composite film structure over a transistor channel in said semiconductor substrate after implanting dopant impurities of a first impurity type into said transistor channel and after annealing said dopant impurities, then, after said forming a composite film structure, forming a gate electrode over said transistor channel and performing an angled ion implantation operation that implants further dopant impurities of said first impurity type into edge portions of said transistor channel through an exposed upper surface of a silicon layer of said composite film structure;
said composite film structure comprising said silicon layer disposed over an undoped silicon carbide layer and said angled ion implantation operation taking place following said forming a gate electrode.

13. In the method as in claim 12, wherein said first impurity type comprises P-type and wherein said improvement further comprises performing a lightly doped drain implant and a source/drain implant after said forming a gate electrode, said lightly doped drain implant and said source/drain implant implanting N-type dopant impurities.

14. In the method as in claim 12, wherein said improvement further comprises performing said angled ion implantation using a tilt angle of less than 15° with respect to the vertical.

15. In the method as in claim 12, wherein said implanting dopant impurities of a first impurity type comprises performing a $V_t$ adjust implant.

16. In the method as in claim 12, wherein said angled ion implantation implants said further dopant impurities of the first impurity type into each of opposed edges of said channel but not extending into a central portion of said channel.

17. In the method as in claim 16, wherein said angled ion implantation implants said further dopant impurities of the first impurity type to a peak dopant concentration of about 10-30 nanometers below a surface of said semiconductor substrate and wherein said transistor channel includes a surface dopant concentration of said first impurity type of less than about 1e18 $cm^{-3}$.

* * * * *